(12) United States Patent
Chee

(10) Patent No.: US 6,396,343 B2
(45) Date of Patent: May 28, 2002

(54) LOW-FREQUENCY, HIGH-GAIN AMPLIFIER WITH HIGH DC-OFFSET VOLTAGE TOLERANCE

(75) Inventor: Johnny Chee, Singapore (SG)

(73) Assignee: Ngee Ann Polytechnic, Singapore (SG)

( * ) Notice: Subject to any disclaimer, the term of this patent is extended or adjusted under 35 U.S.C. 154(b) by 0 days.

(21) Appl. No.: 09/771,339

(22) Filed: Jan. 26, 2001

(51) Int. Cl.⁷ .................................................. H03F 3/45
(52) U.S. Cl. ............................................ 330/69; 330/258
(58) Field of Search .................... 330/69, 258; 327/307

(56) References Cited

U.S. PATENT DOCUMENTS

| | | | |
|---|---|---|---|
| 4,887,045 A | * 12/1989 | Nakayama | 330/69 |
| 5,095,282 A | * 3/1992 | Dayton | 330/258 |
| 5,300,896 A | * 4/1994 | Suesserman | 330/260 |
| 5,568,561 A | * 10/1996 | Whitlock | 330/258 |
| 6,211,731 B1 | * 4/2001 | Fiori, Jr. | 330/69 |
| 6,222,416 B1 | * 4/2001 | Edeler | 330/69 |

* cited by examiner

Primary Examiner—Robert Pascal
Assistant Examiner—Khanh Van Nguyen
(74) Attorney, Agent, or Firm—Columbia IP Law Group, PC

(57) ABSTRACT

The instrumentation amplifier circuit of the present invention is particularly suited for amplifying ECG signals, rejecting common mode signals and removing a DC offset. The preferred embodiment of the present invention basically comprises a front-stage differential amplifier, and a common-mode rejection circuit. By employing a twin-T network, the front stage differential amplifier is able to simultaneously remove the DC offset and achieve high gain using standard off-the-shelf components. The common mode differential gain, however, is zero, which is the desired result. The common-mode rejection circuit removes the common-mode signal to yield only the amplified ECG signal. The present amplifier circuit has a much greater DC offset tolerance than the prior art amplifier while the Common Mode Rejection Ratio (CMRR), residual noise at the output, and the input dynamic range is comparable to that of the prior art amplifier. Moreover, it requires fewer operational amplifiers.

12 Claims, 2 Drawing Sheets

LOW-FREQUENCY, HIGH-GAIN AMPLIFIER WITH HIGH DC-OFFSET VOLTAGE TOLERANCE

FIELD OF THE INVENTION

The present invention relates generally to the field of amplifier circuits, and in particular to low-frequency amplifier circuits.

BACKGROUND OF THE INVENTION

Amplifier circuits utilizing operational amplifiers are well known in the art. For such circuits, it is well understood that only the values of the surrounding impedances need to be properly selected to control the gain of the circuits. If a DC offset voltage needs to be removed from the input signal, a DC-blocking capacitor is added to the circuit. For most applications where the frequency of the input signal is not extremely low and the gain requirement is not very high, standard off-the-shelf components can be used for the amplifier.

In some instances, however, the input signal has extremely low frequency while the gain requirement is very high. An example of such a situation can be found in the instrumentation amplifier (IA) to be used for amplifying the electrical signals of the heart. The graphical recording to these heart signals is known as electrocardiograms (ECG). The instrumentation amplifier to be used for amplifying ECG signals must have the ability to reject DC offset voltages generated between a pair of ECG electrodes. The offset voltage results from unequal contact potentials at the electrode-skin interface caused by electrochemical half-cells which form when ions between the electrode and the skin interchange. The offset voltage, which is typically around 100 mV, is very large compared to the electrocardiogram signals which are around 1 mV.

Most IAs used for ECG provide the DC offset rejection capability by dividing the IA circuit into two stages—a low-gain DC differential amplifier at the front stage followed by a high gain AC amplifier. A typical IA circuitry is shown in FIG. 1 with a gain in the front stage, 5, being 20 and the gain in the back stage, 10, being 50, resulting in an overall gain of 1000 (or 1 V/mV amplification). The AC amplifier cut-off frequency is 0.05 Hz. Gains of 20 and 50 are typical for IAs. As can be seen from FIG. 1, the first stage also includes the circuitry, 15, for rejecting the common mode signal.

Analytically, it can be shown that the differential gain of the 1$^{st}$ stage of the amplifier in FIG. 1 is:

$$A_{DS} = 1 + \frac{R_1 + R_2}{R_C}$$

Since this gain has no frequency discrimination, both the ECG and the DC offset signals will be equally amplified. Because the DC offset voltage is much higher than the signal being amplified, it can be seen that the circuitry of FIG. 1 would certainly saturate the output, if the circuit is not divided into two stages. Although by adding a capacitor $X_C$ in series with $R_C$ frequency discrimination can be obtained, simultaneously achieving 0.05 Hz cut-off frequency and a high gain is currently impractical with standard off-the-shelf components.

The inclusion of the additional stage increases the number of operational amplifiers needed in the overall amplifier circuit. Moreover, it can shown that this prior art amplifier circuit has a low DC offset tolerance, and hence, any aberrant peak in the ECG signal may cause at least a portion of the output to saturate. Such a result is highly undesirable as the ECG reading may falsely indicate a condition in the heart which is, in fact, non-existent.

OBJECT OF THE INVENTION

It is an object of the present invention to overcome the shortcomings of the prior art amplifier.

Particularly, it is an object of the present invention to provide an amplifier circuit which can remove the DC offset while achieving high gain.

It is another object of the present invention to provide an amplifier circuit which minimizes the number of operation amplifiers used.

It is yet another object of the present invention to provide an amplifier circuit which can be made using all off-the-shelf components.

SUMMARY OF THE INVENTION

The instrumentation amplifier circuit of the present invention is particularly suited for amplifying ECG signals, rejecting common mode signals and removing a DC offset. The preferred embodiment of the present invention basically comprises a front-stage differential amplifier, and a common-mode rejection circuit. By employing a twin-T network, the front stage differential amplifier is able to simultaneously remove the DC offset and achieve high gain using standard off-the-shelf components. The common mode differential gain, however, is zero, which is the desired result. The common-mode rejection circuit removes the common-mode signal to yield only the amplified ECG signal. The present amplifier circuit has a much greater DC offset tolerance than the prior art amplifier while the Common Mode Rejection Ratio (CMRR), residual noise at the output, and the input dynamic range is comparable to that of the prior art amplifier. Moreover, it requires fewer operational amplifiers.

DETAILED DESCRIPTION OF THE INVENTION

Electrocardiogram (ECG) signals have a unique set of characteristics. Mainly the characteristics are low frequency and low amplitude with a relatively high DC offset in relation to the main signal, usually embedded in very strong common interference signal picked up from the mains power line. The instrumentation amplifier circuit of the present invention is particularly suited for amplifying ECG signals, rejecting common mode signals and removing the DC offset, and hence, the present invention shall be described in the context of ECG application as way of illustrating the preferred embodiment of the present invention. However, it should be understood that the present invention may be employed in other applications where the signal to be amplified displays a set of characteristics similar to those mentioned herein.

An ECG signal generally carries a voltage level around 1 mV and frequency bandwidth of 0.05 Hz to 100 Hz. The common mode interference signal may vary in amplitude up to 600 to 1000 mV operating at around power line frequencies (50 Hz or 60 Hz depending on the mains frequency used by the country). The DC offset may vary up to around 100 mV. It is generally required that the ECG signal be amplified about 1000 times. Hence the instrumentation amplifier needs to have the following characteristics: high gain; ability to remove the DC offset; reject the common mode signal.

Figure 2:
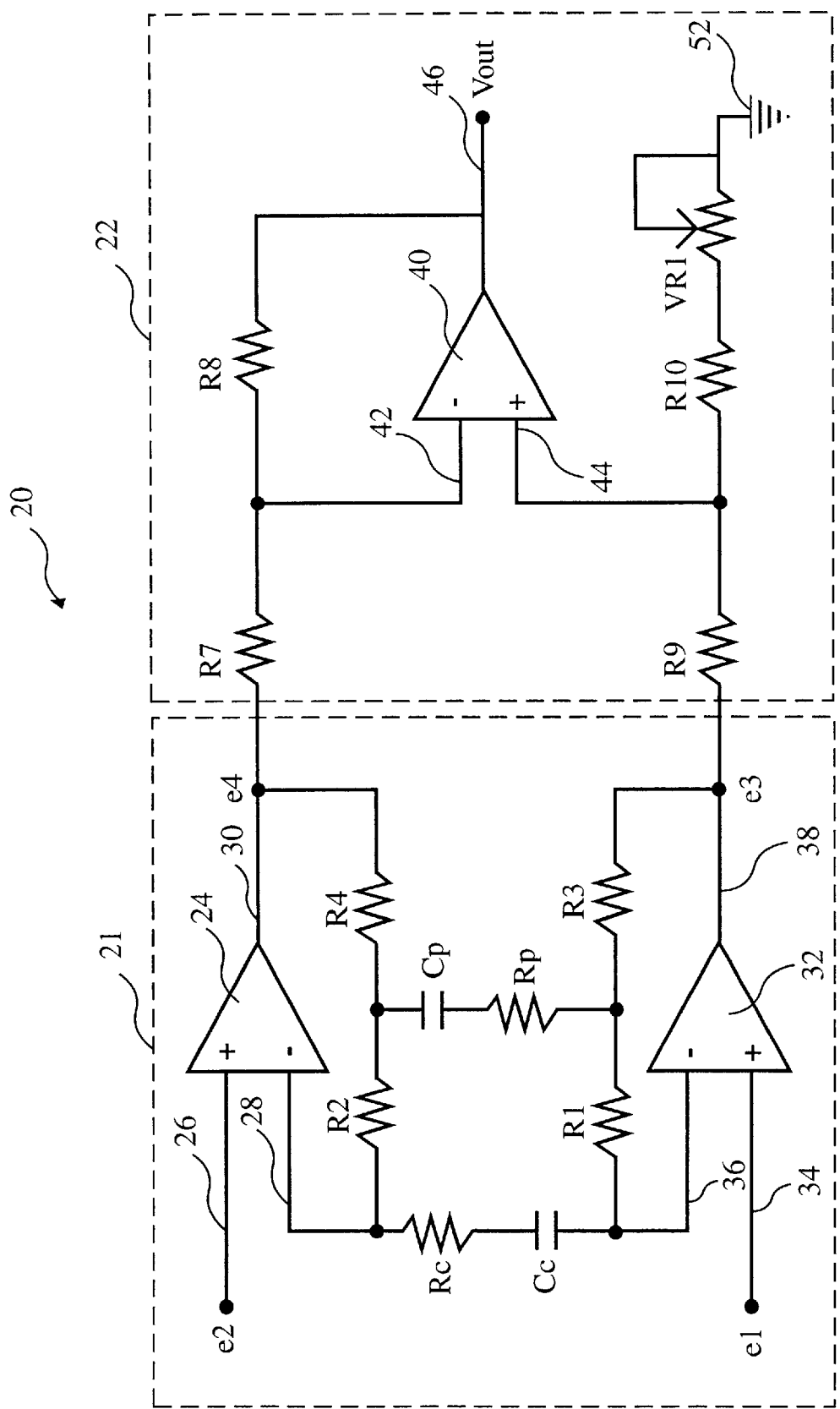
FIG. 2 is a schematic diagram of the present instrumentation amplifier circuitry using only a single stage for the amplification.

The preferred embodiment of the present invention is shown in FIG. 2. The present instrumentation amplifier circuit 20 basically comprises a front-stage differential amplifier 21 using a twin T-feedback network, and a common-mode rejection circuit 22. Referring to FIG. 2, the differential amplifier 21 includes a first operating amplifier 24 and a second operating amplifier 32. The first operating amplifier has a non-inverting input 26, an inverting input 28, and an output 30. The second operating amplifier 32 has a non-inverting input 34, an inverting input 36, and an output 38. The non-inverting input 26 of the first operating amplifier 24 receives the differential input signal e2. The non-inverting input 34 of the second operating amplifier 32 receives the differential input signal e1. The output 30 of the operating amplifier 24 outputs the differential output signal e4. The output 38 of the operating amplifier 32 outputs the differential output signal e3.

Connected in between the first operating amplifier 24 and the second operating amplifier 32 is the twin T-feedback network where the resistors $R_2$ and $R_4$ form the first "T" with the capacitor $C_p$ and the resistor $R_p$, and where the resistors $R_1$ and $R_3$ form the second "T" with the resistor $R_p$ and the capacitor $C_p$. Bridging the twin T-network is the resistor $R_C$ and the capacitor $C_c$. The resistor $R_4$ is connected to the output 30 of the first operating amplifier 24, and the resistor $R_3$ is connected to the output 38 of the second operating amplifier 32. The resistors $R_2$ and $R_c$ are connected to the inverting input 28 of the first operating amplifier 24, and the resistor $R_1$ and the capacitor $C_c$ are connected to the inverting input 36 of the second operating amplifier 32.

At the outputs 30 and 38, the common mode differential gain $A_c$ is zero which is a desired characteristic of the ECG instrumentation amplifier. The differential gain of the amplifier at the outputs 30 and 38, however, is the following:

$$A_{DN} = 1 + \frac{2(R_1 + R_3)}{(R_C - jX_C)} + \left(\frac{2R_3}{R_p - jX_p}\right)\left(1 + \frac{2R_1}{R_C - jX_C}\right)$$

where $X_C$ and $X_P$ are the reactances of the capacitors $C_C$ and $C_P$.

The equation reveals that the frequency discrimination exists, is of second order, and that it is practical to obtain high gain and low cut-off frequency. For instance, a gain of about 1000 and a cut-off frequency of 0.05 Hz was achieved using the following off-the-shelf components:

$R_1$=4.7 MΩ
$R_2$=4.7 MΩ
$R_3$=4.7 MΩ
$R_4$=4.7 MΩ
$R_c$=300 KΩ
$R_p$=300 KΩ
$X_c$=10 μF
$X_p$=10 μF

All operational amplifiers used were LF355.

To remove the common mode signal, a common mode rejection circuitry 22 is added to the front-stage amplifier circuitry 21. Referring to FIG. 2, the common mode rejection circuitry 22 is of a standard design which includes an operating amplifier 40 having a inverting input 42, non-inverting input 44, and an output $V_{out}$ 46. Connecting the output 46 and the inverting input 42 is the resistor $R_8$. Connecting the non-inverting input 44 and the ground 52 are the resistor $R_{10}$ and the variable resistor $VR_1$. The common mode rejection circuitry 22 is connected to the front-stage amplifier circuitry via the resistors $R_7$ and $R_9$. Together, the configuration of the resistors $R_7$, $R_8$, $R_9$, $R_{10}$, $VR_1$ form a standard subtraction circuit with the operating amplifier 40. Its output 46 is thus the result of subtracting the signal at its negative input (i.e. output 30) from the signal at its positive input (i.e. output 38). $VR_1$ is generally included to add to the value of $R_{10}$ so as to compensate for the tolerance in standard component values. However, it is possible that $VR_1$ may be omitted in certain circumstances. Although various off-the-shelf components are possible, the following components and values were used with good results:

$R_7$=91 KΩ
$R_8$=91 KΩ
$R_9$=91 KΩ
$R_{10}$=81 KΩ
$VR_1$=25 KΩ

In general, high performance subtraction is achieved whenever the values are closely matched as follows:

$R_7 = R_8 = R_9 = R_{10} + VR_1$

Figure 1:
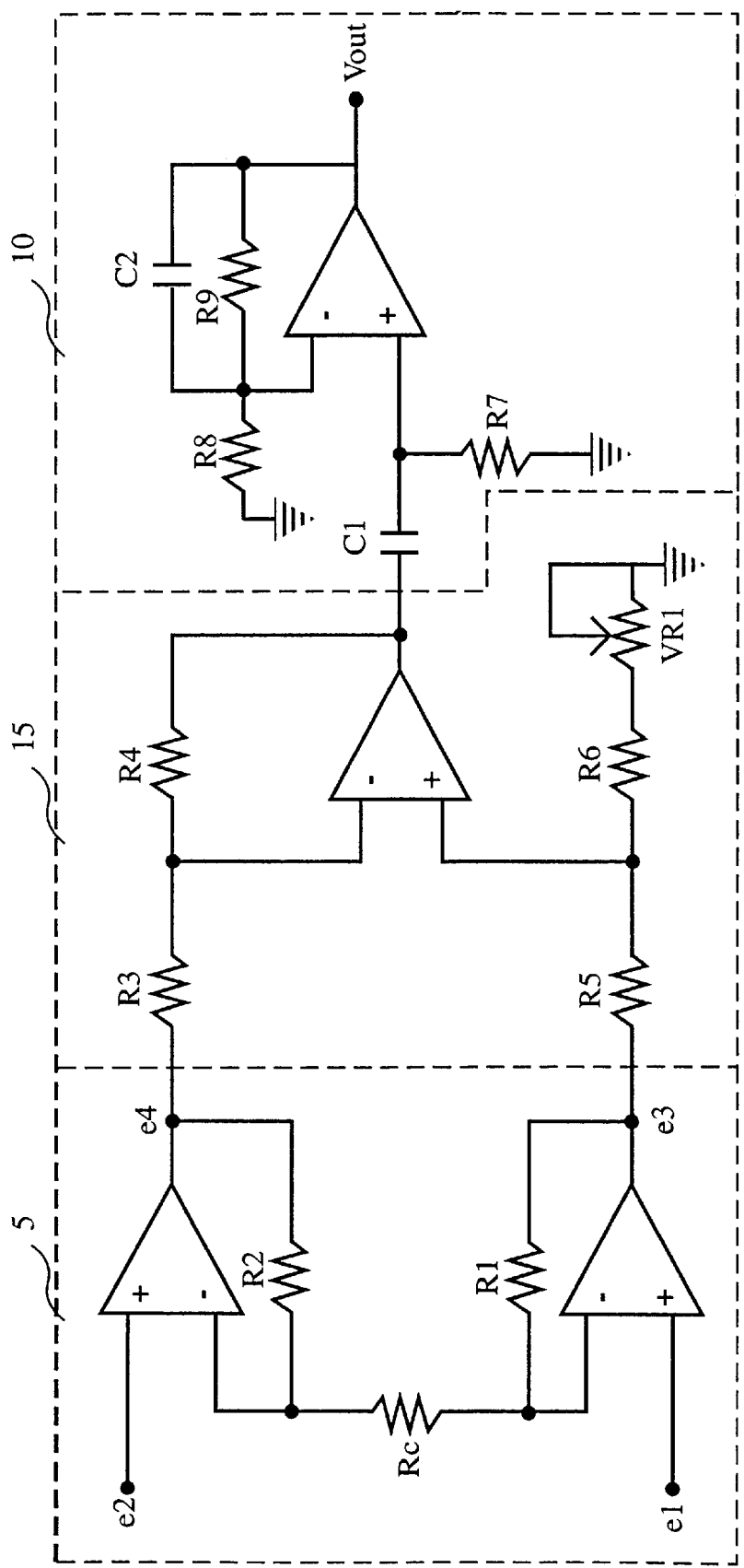
FIG. 1 is a schematic diagram of the prior art instrumentation amplifier circuitry using two stages for the amplification.

The experimental results showed that the present circuitry 20 performs at least equivalent to the prior art two-stage amplifier circuitry shown in FIG. 1 in many respects, and superiorly outperformed the prior art circuitry in its ability to tolerate DC offset. Some of the performance measurement comparisons are shown below:

| Comparison Chart | | |
| --- | --- | --- |
| Measurements | Prior Art Amplifier | Present Amplifier |
| CMRR (at 50 Hz) | 100 dB | 99 dB |
| Residual Noise (at o/p) | 40 mV pp | 70 mV pp |
| Input dynamic range | −1.7 to +3.5 V | −2.2 to +3.7 V |
| DC Offset tolerance | −0.17 to +0.21 V | −3.2 to +3.18 V |

As can be seen from the chart above, the present amplifier circuit has a much greater DC offset tolerance than the prior art amplifier while the Common Mode Rejection Ratio (CMRR), residual noise at the output, and the input dynamic range is comparable to that of the prior art amplifier.

The present invention may be embodied in other specific forms without departing from the spirit or essential characteristics thereof. For instance, the subtractor circuit may be omitted in applications where the differential outputs are sufficient. For example, the differential outputs 30, 38 may be connected to the inputs of a differential input analogue-to-digital converter (ADC). The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

I claim:

1. An amplifier circuit comprising:
   a first operational amplifier having a non-inverting input, an inverting input, and a differential output e4, said non-inverting input receiving a differential input signal e2;

a second operational amplifier having a non-inverting input, an inverting input, and a differential output e3, said non-inverting input receiving a differential input signal e1;

a twin T-feedback network including $R_1$, $R_2$, $R_3$, $R_4$, $R_p$, $C_p$, where the resistors $R_2$ and $R_4$ form the first "T" with the capacitor $C_p$ and the resistor $R_p$, and where the resistors $R_1$ and $R_3$ form the second "T" with the resistor $R_p$ and the capacitor $C_p$; and a resistor $R_C$ and a capacitor $C_c$ connected in series, wherein the resistor $R_4$ is connected to the output e4 of the first operating amplifier, the resistor $R_3$ is connected to the output e3 of the second operating amplifier, the resistors $R_2$ and $R_c$ are connected to the inverting input of the first operating amplifier, and the resistor $R_1$ and the capacitor $C_c$ are connected to the inverting input of the second operating amplifier, and wherein said e2 and e1 is a low frequency, low amplitude differential signal having a relatively high DC offset, and wherein values for $R_1$, $R_2$, $R_3$, $R_4$, $R_p$, $R_C$, $C_c$, and $C_p$ are chosen to give said circuit a high gain at the differential outputs e3 and e4 and a cut-off frequency sufficient to remove said DC offset.

2. The amplifier circuit as recited in claim 1 wherein said e1 and e2 are ECG signals.

3. The amplifier circuit as recited in claim 1 wherein values for $R_1$, $R_2$, $R_3$, $R_4$, $R_p$, $R_C$, $C_c$, and $C_p$ are approximately the following:

$R_1$=4.7 MΩ

$R_2$=4.7 MΩ

$R_3$=4.7 MΩ

$R_4$=4.7 MΩ

$R_c$=300 KΩ

$R_p$=300 KΩ

$X_c$=10 μF $X_p$=10 μF where $X_C$ and $X_P$ are the reactances of the capacitors $C_C$ and $C_P$.

4. The amplifier circuit as recited in claim 1 further comprising a common-mode rejection circuit connected to said differential outputs e3 and e4.

5. The amplifier circuit as recited in claim 3 further comprising a common-mode rejection circuit connected to said differential outputs e3 and e4.

6. The amplifier circuit as recited in claim 2 further comprising a common-mode rejection circuit connected to said differential outputs e3 and e4.

7. The amplifier circuit as recited in claim 4 wherein said common-mode rejection circuit comprises a third operational amplifier having a inverting input, non-inverting input, and an output $V_{out}$, a resistor $R_8$, said resistor $R_8$ connecting the output $V_{out}$ and the inverting input, a resistor $R_{10}$ and a variable resistor $VR_1$, said resistor $R_{10}$ and said variable resistor $VR_1$ connecting the non-inverting input and a ground;

a resistor $R_7$ connecting said inverting input of said third operational amplifier with said output e4; and a resistor $R_9$ connecting said non-inverting input of said third operational amplifier with said output e3.

8. The amplifier circuit as recited in claim 6 wherein said common-mode rejection circuit comprises a third operational amplifier having a inverting input, non-inverting input, and an output $V_{out}$, a resistor $R_8$, said resistor $R_8$ connecting the output $V_{out}$ and the inverting input, a resistor $R_{10}$ and a variable resistor $VR_1$, said resistor $R_{10}$ and said variable resistor $VR_1$ connecting the non-inverting input and a ground;

a resistor $R_7$ connecting said inverting input of said third operational amplifier with said output e4; and a resistor $R_9$ connecting said non-inverting input of said third operational amplifier with said output e3.

9. The amplifier circuit as recited in claim 7 wherein following condition is substantially met: $R_7=R_8=R_9=R_{10}+VR_1$.

10. The amplifier circuit as recited in claim 8 wherein following condition is substantially met: $R_7=R_8=R_9=R_{10}+VR_1$.

11. The amplifier circuit as recited in claim 9 wherein values for said resistors and variable resistor are substantially as follows:

$R_7$=91 KΩ

$R_8$=91 KΩ

$R_9$=91 KΩ

$R_{10}$=81 KΩ

$VR_1$=25 KΩ.

12. The amplifier circuit as recited in claim 10 wherein values for said resistors and variable resistor are substantially as follows:

$R_7$=91 KΩ

$R_8$=91 KΩ

$R_9$=91 KΩ

$R_{10}$=81 KΩ

$VR_1$=25 KΩ.

* * * * *

UNITED STATES PATENT AND TRADEMARK OFFICE
CERTIFICATE OF CORRECTION

PATENT NO. : 6,396,343 B2  Page 1 of 1
DATED : May 28, 2002
INVENTOR(S) : Johnny Chee It is certified that error appears in the above-identified patent and that said Letters Patent is hereby corrected as shown below:

<u>Title page,</u>
Item [30], please insert the following:

-- [30] Foreign Application Priority Data
  Jan. 28, 2000   (SG) ........................200000515-7 --

Signed and Sealed this

Twenty-fifth Day of February, 2003

JAMES E. ROGAN
*Director of the United States Patent and Trademark Office*